(12) United States Patent
Motofuji et al.

(10) Patent No.: US 10,003,169 B2
(45) Date of Patent: Jun. 19, 2018

(54) LASER MODULE

(71) Applicant: Panasonic Intellectual Property Management Co., Ltd., Osaka (JP)

(72) Inventors: Takuma Motofuji, Osaka (JP); Takayuki Yoshida, Shiga (JP); Naoto Ueda, Hyogo (JP); Kouji Oomori, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/511,049

(22) PCT Filed: Aug. 5, 2015

(86) PCT No.: PCT/JP2015/003932
§ 371 (c)(1),
(2) Date: Mar. 14, 2017

(87) PCT Pub. No.: WO2016/063436
PCT Pub. Date: Apr. 28, 2016

(65) Prior Publication Data
US 2017/0288365 A1 Oct. 5, 2017

Related U.S. Application Data

(60) Provisional application No. 62/067,047, filed on Oct. 22, 2014.

(51) Int. Cl.
*H01S 3/08* (2006.01)
*H01S 5/00* (2006.01)
(Continued)

(52) U.S. Cl.
CPC .......... *H01S 5/005* (2013.01); *G02B 19/0057* (2013.01); *H01S 5/02288* (2013.01); *H01S 5/4031* (2013.01)

(58) Field of Classification Search
CPC .... H01S 5/005; H01S 5/02288; H01S 5/4031; G02B 19/0057
See application file for complete search history.

(56) References Cited

U.S. PATENT DOCUMENTS

| | | |
|---|---|---|
| 4,813,762 A | 3/1989 | Leger et al. |
| 9,318,875 B1 | 4/2016 | Goutain |

(Continued)

FOREIGN PATENT DOCUMENTS

| | | |
|---|---|---|
| JP | 2003-232968 | 8/2003 |
| JP | 2012-164981 | 8/2012 |
| JP | 2014-095916 | 5/2014 |

OTHER PUBLICATIONS

International Search Report of PCT application No. PCT/JP2015/003932 dated Oct. 6, 2015.

(Continued)

*Primary Examiner* — Yuanda Zhang
(74) *Attorney, Agent, or Firm* — Wenderoth, Lind & Ponack, L.L.P.

(57) ABSTRACT

A laser module according to the present disclosure includes a laser diode, a first collimating lens, and a beam twister. The laser diode includes a plurality of emitters and emits laser light from each of the plurality of emitters through a light emission surface. The first collimating lens is provided at a first distance from the light emission surface of the laser diode and parallelizes a fast-axis-wise divergence of the laser light. The beam twister is provided at a second distance away from the first collimating lens and turns the laser light approximately 90 degrees. Each of the plurality of emitters has a width of 5 μm to 120 μm on the light emission surface. The plurality of emitters have a pitch of 295 μm to 305 μm on the light emission surface.

10 Claims, 12 Drawing Sheets

(51) Int. Cl.
H01S 5/022 (2006.01)
H01S 5/40 (2006.01)
G02B 19/00 (2006.01)

(56) References Cited

U.S. PATENT DOCUMENTS

| | | |
|---|---|---|
| 2003/0123153 A1* | 7/2003 | Ohtomo ............... G01C 15/004 359/618 |
| 2004/0125192 A1* | 7/2004 | Ohsugi ................. G02B 7/026 347/233 |
| 2006/0103939 A1 | 5/2006 | Zheng et al. |
| 2008/0019010 A1* | 1/2008 | Govorkov .......... B23K 26/0613 359/641 |
| 2008/0267246 A1 | 10/2008 | Volodin et al. |
| 2008/0310466 A1* | 12/2008 | Oguri ..................... H01S 5/141 372/22 |
| 2009/0251697 A1 | 10/2009 | Cutillas et al. |
| 2013/0022064 A1 | 1/2013 | Raring et al. |
| 2014/0086539 A1 | 3/2014 | Goutain et al. |
| 2015/0211724 A1 | 7/2015 | Goutain et al. |
| 2015/0285446 A1 | 10/2015 | Goutain et al. |
| 2016/0265729 A1 | 9/2016 | Goutain et al. |

OTHER PUBLICATIONS

Extended European Search Report dated Oct. 18, 2017 in European Application No. 15853450.3.

* cited by examiner

PRIOR ART

LASER MODULE

This application is a U.S. national stage application of the PCT International Application No. PCT/JP2015/003932 filed on Aug. 5, 2015, which claims the benefit of U.S. Provisional Application 62/067,047 filed on Oct. 22, 2014, the contents all of which are incorporated herein by reference.

TECHNICAL FIELD

The present disclosure relates to a laser module, and particularly to a laser module including a laser diode in which a plurality of emitters are formed.

BACKGROUND ART

In recent years, in the field of laser processing such as laser cutting and laser welding, it is demanded that a laser module using a laser diode output laser light of high beam quality at high output level.

Figure 26:
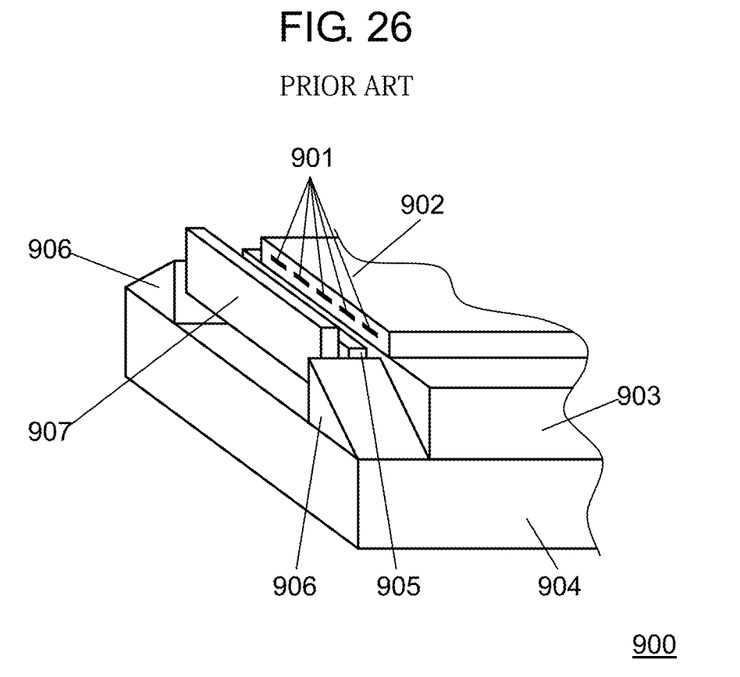
FIG. 26 is a perspective and side view illustrating a schematic configuration of conventional laser emitter module 900.

Conventional laser emitter module 900 described in Patent Literature (PTL) 1 is described with reference to FIG. 26. FIG. 26 is a perspective view of conventional laser emitter module 900.

As illustrated in FIG. 26, conventional laser emitter module 900 includes: laser emitter bar 902 having five emitters 901; heat sink 903; heat sink spacer 904; fast axis collimator 905; prism member 906; and beam conditioning optic 907. Laser emitter bar 902 is fixed to heat sink 903, and heat sink 903 is fixed to heat sink spacer 904. Fast axis collimator 905 and beam conditioning optic 907 are fixed to prism member 906 fixed to heat sink spacer 904.

Fast axis collimator 905 collimates laser light output from emitters 901, in a fast axis direction. As beam conditioning optic 907, a beam twister is used, for example. Beam conditioning optic 907 rotates incident laser light approximately 90 degrees and emits the resulting laser light.

With this configuration, in the fast axis direction in which the divergence angle of laser light is large, fast axis collimator 905 collimates the laser light in the fast axis direction, and the laser light can be rotated 90 degrees such that a fast axis and a slow axis are interchanged. Thereafter, in a slow axis direction in which the divergence angle of laser light is relatively small, a slow axis collimator (not illustrated in the drawings) collimates the laser light in the slow axis direction, and thus collimation of the laser light is completed.

CITATION LIST

Patent Literature

PTL 1: Unexamined Japanese Patent Publication No. 2014-095916

SUMMARY OF THE INVENTION

Emitter 901 of conventional laser emitter module 900 is defined in a wide range as having a width of approximately 50 microns to 300 microns and a cavity length of approximately 0.5 mm to approximately 5 mm, and the pitch (the position distance) between emitters 901 is not described. For obtaining high output laser light of high beam quality from a single laser emitter bar, however, the disclosure in such a wide range alone is not enough to obtain high output laser light of high beam quality because the output and the beam quality of laser light are significantly dependent on the width of the emitter and the pitch between the emitters.

In order to solve the aforementioned problem, a laser module according to the present disclosure includes a laser diode, a first collimating lens, and a beam twister. The laser diode includes a plurality of emitters and emits laser light from each of the plurality of emitters through a light emission surface. The first collimating lens is provided at a first distance away from the light emission surface of the laser diode and parallelizes a fast-axis-wise divergence of the laser light. The beam twister is provided at a second distance away from the first collimating lens and turns the laser light approximately 90 degrees. Each of the plurality of emitters has a width of 5 μm to 120 μm on the light emission surface. The plurality of emitters have a pitch of 295 μm to 305 μm on the light emission surface.

As described above, with the laser module in the present disclosure, due to the width of the emitter and the pitch between the emitters being more specifically defined, it is possible to obtain high output laser light of high beam quality in the laser processing such as laser cutting and laser welding.

DESCRIPTION OF EMBODIMENTS

Exemplary Embodiment

Hereinafter, an exemplary embodiment of the present disclosure will be described with reference to FIG. 1 to FIG. 25.

1. Description of Laser Module 1

Figure 1:
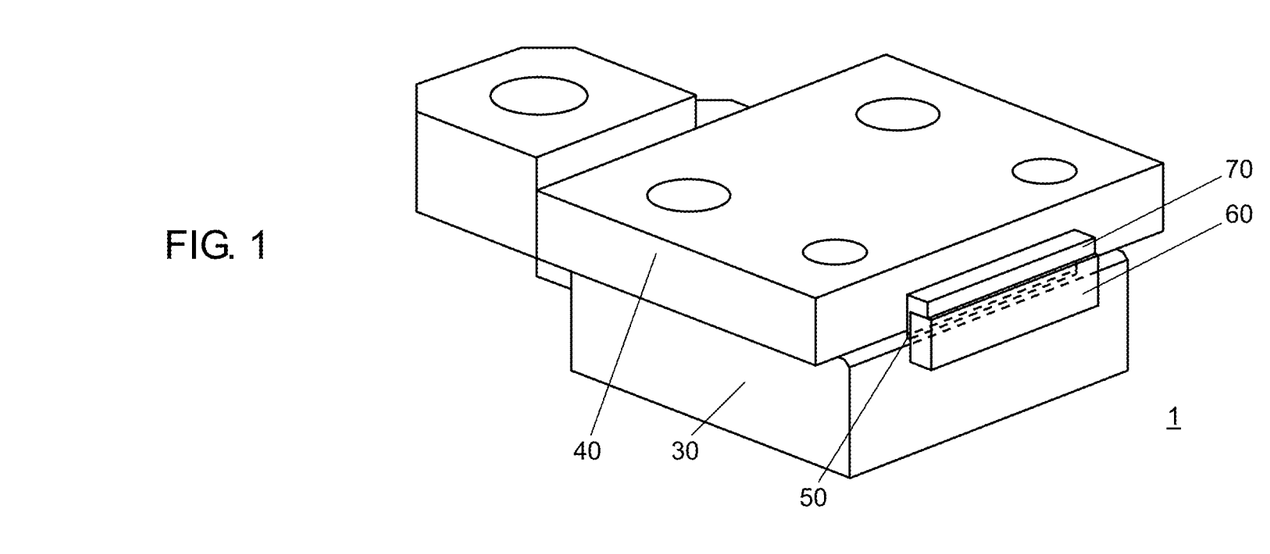
FIG. 1 is a perspective view illustrating a schematic configuration of laser module 1 according to an exemplary embodiment.
Figure 2:
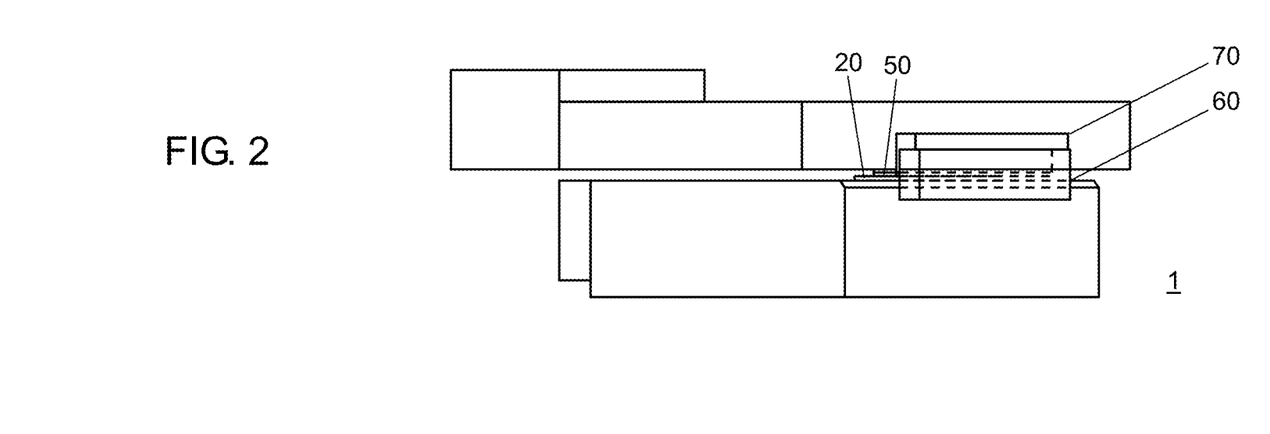
FIG. 2 is a horizontal perspective view of laser module 1 according to an exemplary embodiment.
Figure 3:
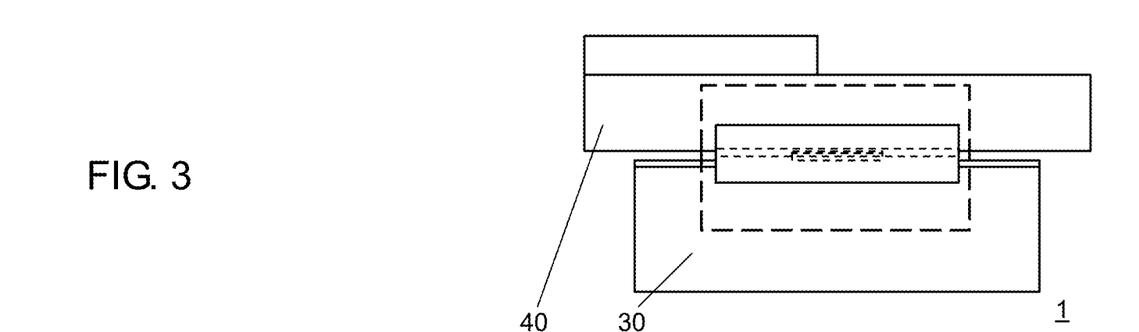
FIG. 3 is a front view of laser module 1 according to an exemplary embodiment.
Figure 4:
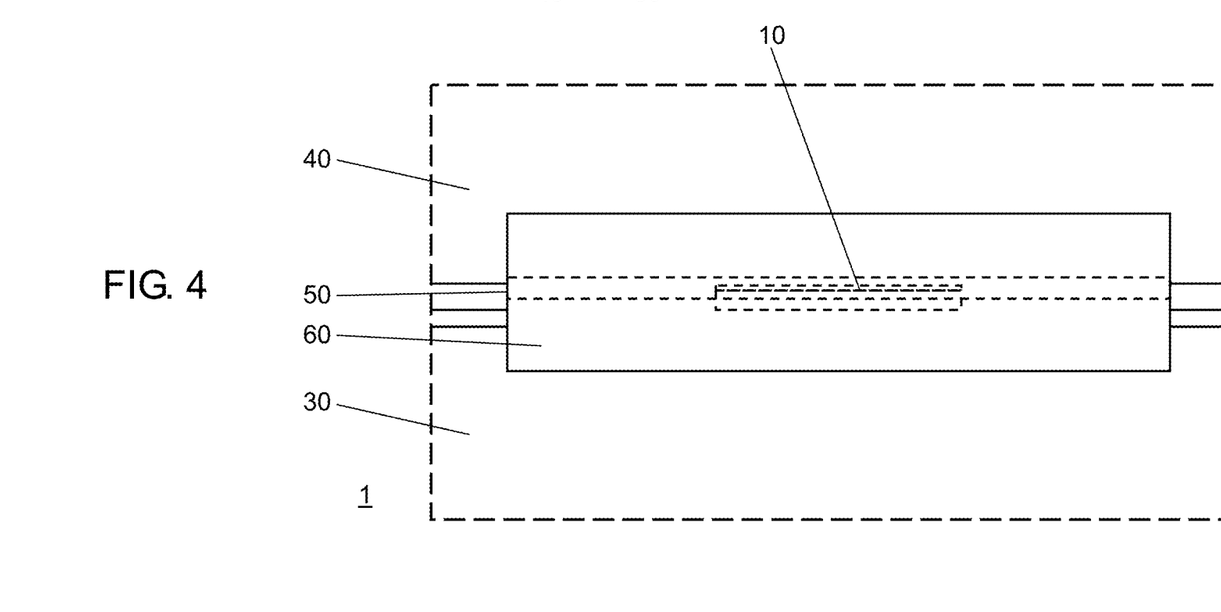
FIG. 4 is an enlarged view of the portion enclosed by the dotted line in FIG. 3.
Figure 5:
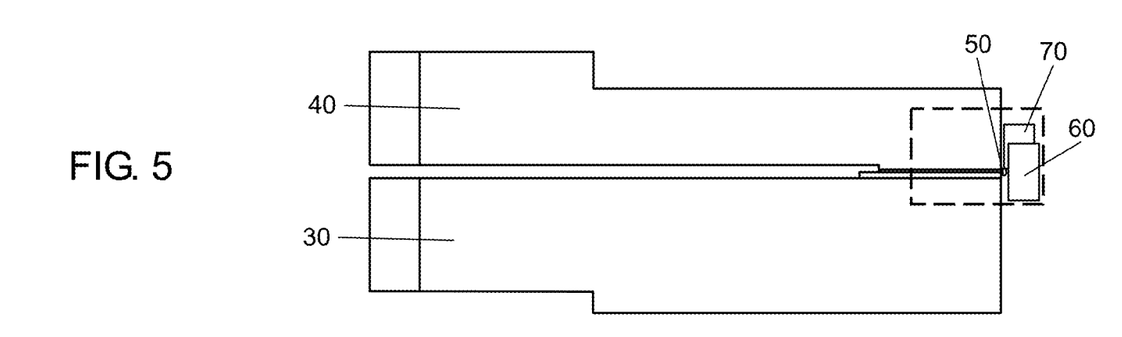
FIG. 5 is a side view of laser module 1 according to an exemplary embodiment.
Figure 6:
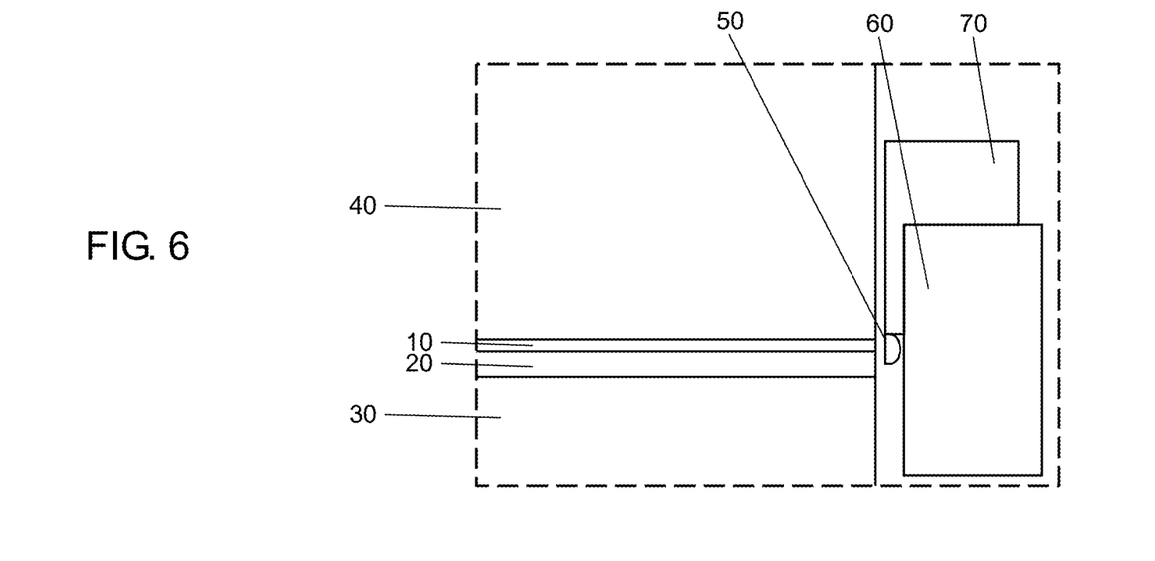
FIG. 6 is an enlarged view of the portion enclosed by the dotted line in FIG. 5.

FIG. 1 is a perspective view illustrating a schematic configuration of laser module 1 according to the present exemplary embodiment. FIG. 2 is a horizontal perspective view of laser module 1 according to the present exemplary embodiment. FIG. 3 is a front view of laser module 1 according to the present exemplary embodiment. FIG. 4 is an enlarged view of the portion enclosed by the dotted line in FIG. 3. FIG. 5 is a side view of laser module 1 according to the present exemplary embodiment. FIG. 6 is an enlarged view of the portion enclosed by the dotted line in FIG. 5.

As illustrated in FIG. 1 to FIG. 6, in laser module 1 according to the present exemplary embodiment, laser diode 10 that outputs laser light from emitters 11 is mounted on sub-mount 20, and laser diode 10 and sub-mount 20 are sandwiched between lower electrode block 30 and upper electrode block 40. Lower electrode block 30 and upper electrode block 40 have an electrode function for connecting laser diode 10 to a power supply (not illustrated in the drawings) and a radiator function for releasing heat generated by laser diode 10.

A light emission surface of laser diode 10 is positioned so as to be substantially flush with side surfaces of lower electrode block 30 and upper electrode block 40 (that correspond to the front surface in FIG. 3 and FIG. 4 and the right end surface in FIG. 5 and FIG. 6). A plurality of emitters 11 are aligned on the light emission surface of laser diode 10. When an electric current flows through laser diode 10, laser light is output from each of emitters 11 from the light emission surface. The width of laser diode 10, the width of emitter 11, the number of emitters 11, the pitch between emitters 11, and the like will be described later in detail.

Fast collimating lens 50 (a first collimating lens) is provided facing the light emission surface of laser diode 10 and at a predetermined distance (a first distance) away from the light emission surface. Fast collimating lens 50 collimates the fast-axis-wise divergence of the laser light output from laser diode 10. Fast collimating lens 50 has a flat surface and a curved surface. In the present exemplary embodiment, fast collimating lens 50 is provided so that the flat surface of fast collimating lens 50 is on the laser diode 10 side and the curved surface of fast collimating lens 50 is on the side opposite laser diode 10. Note that fast collimating lens 50 may be provided so that the curved surface of fast collimating lens 50 is on the laser diode 10 side and the flat surface of fast collimating lens 50 is on the side opposite laser diode 10. The structure and the position of fast collimating lens 50 will be described later in detail.

On the side opposite laser diode 10 when viewed from fast collimating lens 50, beam twister 60 is provided at a predetermined distance (a second distance) away from fast collimating lens 50. Beam twister 60 turns laser light emitted from fast collimating lens 50 approximately 90 degrees. The structure and the position of beam twister 60 will be described later in detail. Note that fast collimating lens 50 and beam twister 60 are fixed to pedestal 70 so that a positional relationship between fast collimating lens 50 and beam twister 60 is defined.

As described above, the laser light emitted from laser diode 10 is first collimated in the fast axis direction by fast collimating lens 50, thereby allowing the fast-axis-wise divergence of the laser light to be minimized. Furthermore, the laser light emitted from fast collimating lens 50 is turned by beam twister 60, thereby allowing overlapping of laser light from the adjacent emitters to be minimized and avoided at slow-axis-wise divergence, too. This makes it possible to minimize the pitch (the position distance) between the plurality of emitters 11 according to the width thereof and to output laser light of high beam quality at high output level.

2. Description of Fast Collimating Lens 50

Figure 7:
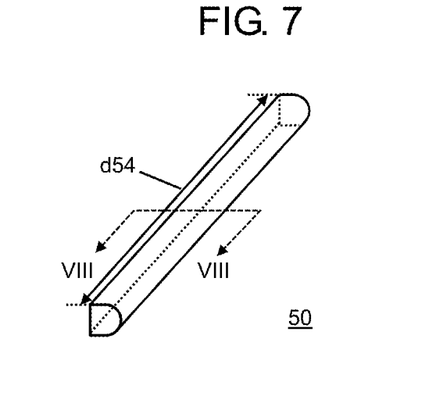
FIG. 7 is a perspective view of fast collimating lens 50 according to an exemplary embodiment.
Figure 8:
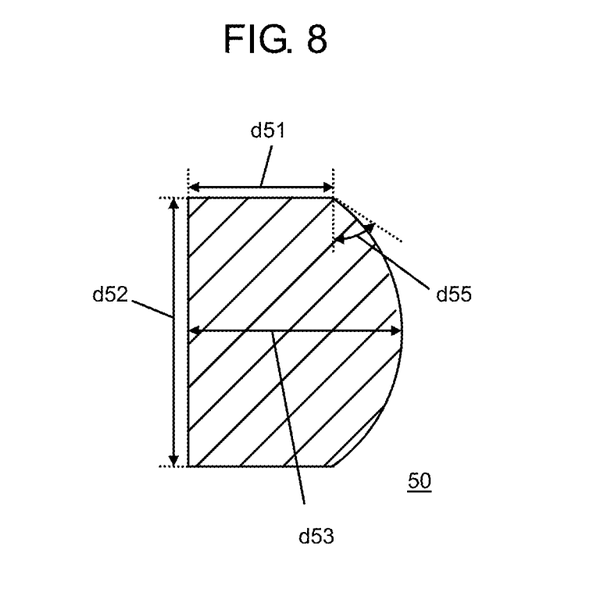
FIG. 8 is a cross-sectional view taken along line VIII-VIII in FIG. 7.

Next, fast collimating lens 50 will be described with reference to FIG. 7 and FIG. 8. FIG. 7 is a perspective view of fast collimating lens 50 according to the present exemplary embodiment. FIG. 8 is a cross-sectional view taken along line VIII-VIII in FIG. 7.

As illustrated in FIG. 7 and FIG. 8, fast collimating lens 50 is a columnar optic, the cross-sectional shape of which is the shape of a lens convex on one side. In the present exemplary embodiment, fast collimating lens 50 is 0.0984 mm in thickness d51 of the top surface, 0.244 mm in height d52 of the side surface, 0.1700 mm in thickness d53 at the center, and 12 mm in length d54 of the side surface. Note that the up-and-down direction in FIG. 8 is defined as the up-and-down direction of fast collimating lens 50, and the plane including the up-and-down direction in FIG. 8 and the direction perpendicular to the sheet of the drawing is defined as the side surface of fast collimating lens 50. The left-and-right direction in FIG. 8 is defined as the thickness direction of fast collimating lens 50, and the middle between the top surface and the bottom surface is defined as the center. The length of the side surface of fast collimating lens 50 is a length in the direction perpendicular to the sheet of FIG. 8. For the purpose of transmitting all the laser light from laser diode 10, length d54 of the side surface of fast collimating lens 50 is greater than the width of laser diode 10 (the length of the light emission surface in the lengthwise direction). In the present exemplary embodiment, the curved surface of fast collimating lens 50, which is the right side surface in FIG. 8, has a radius of curvature of 0.1188 mm, and angle d55 formed between an end of the curved surface and the vertical direction for the top surface is 52.2 degrees. The index of refraction of fast collimating lens 50 is 1.85280. As described earlier, fast collimating lens 50 is provided in front of the light emission surface of laser diode 10 and collimates the laser light emitted from emitters 11 of laser diode 10, in the fast axis direction.

3. Description of Beam Twister 60

Figure 9:
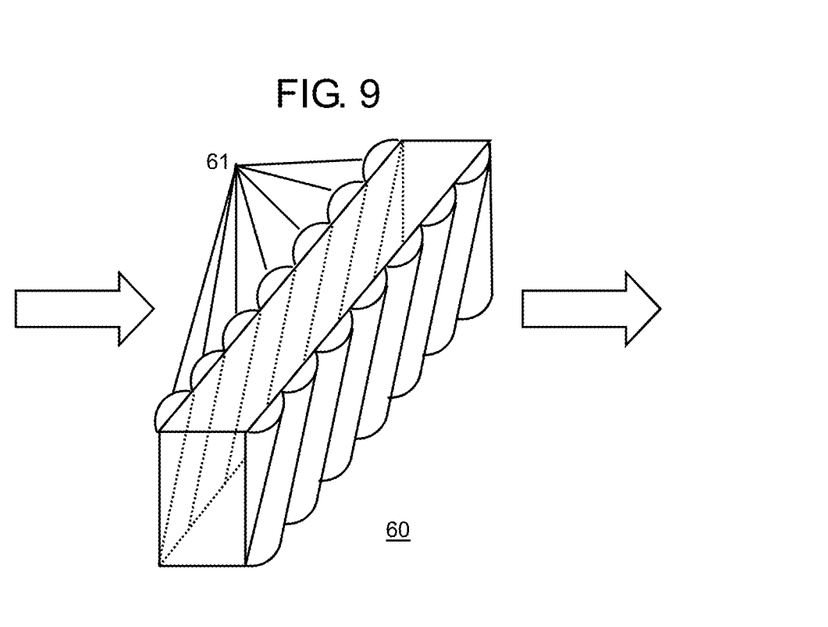
FIG. 9 is a partial perspective view of beam twister 60 according to an exemplary embodiment.
Figure 10:
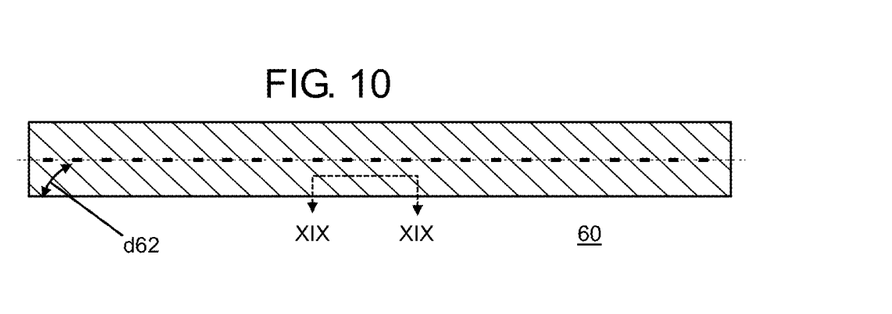
FIG. 10 is a front view of beam twister 60 according to an exemplary embodiment.
Figure 11:
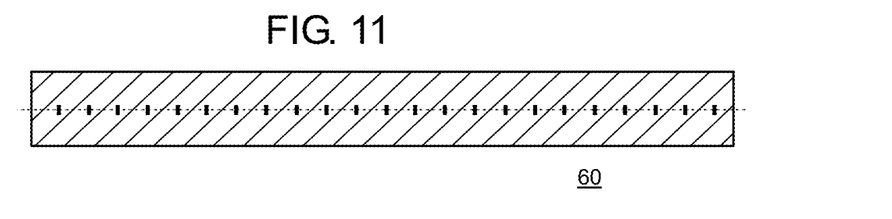
FIG. 11 is a rear view of beam twister 60 according to an exemplary embodiment.
Figure 12:
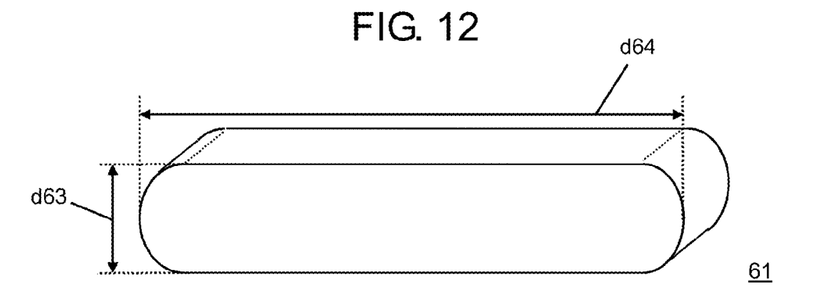
FIG. 12 is a perspective view of cylinder 61 included in beam twister 60 according to an exemplary embodiment.
Figure 13:
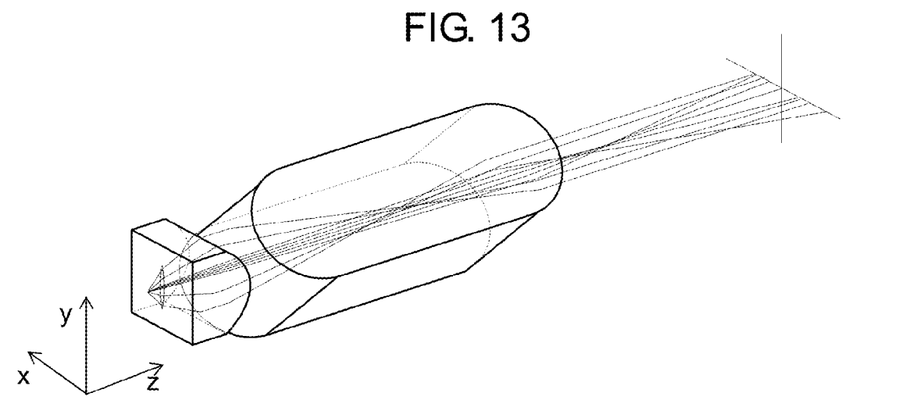
FIG. 13 is a perspective view illustrating an optical path of laser light through beam twister 60 according to an exemplary embodiment.
Figure 14:
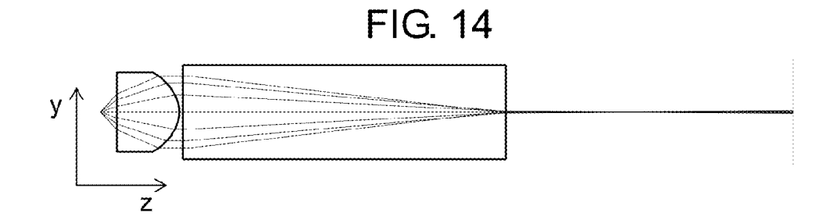
FIG. 14 is a side view illustrating an optical path of laser light through beam twister 60 according to an exemplary embodiment.
Figure 15:
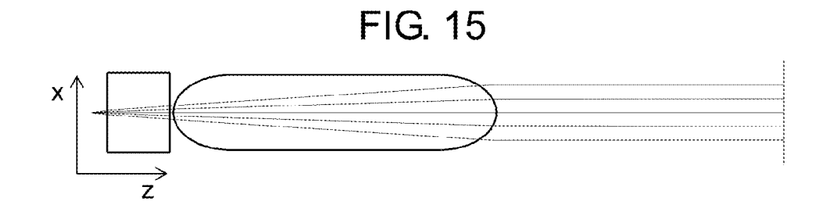
FIG. 15 is a top view illustrating an optical path of laser light through beam twister 60 according to an exemplary embodiment.

Next, beam twister 60 will be described with reference to FIG. 9 to FIG. 15. FIG. 9 is a partial perspective view of beam twister 60 according to the present exemplary embodiment. FIG. 10 is an illustration of beam twister 60 according to the present exemplary embodiment as seen from the front surface side (from the laser light entry surface side). FIG. 11 is an illustration of beam twister 60 according to the present exemplary embodiment as seen from the rear surface side (from the laser light exit surface side). FIG. 12 is a perspective view of cylinder 61 included in beam twister 60 according to the present exemplary embodiment. FIG. 13 is a perspective view illustrating an optical path of laser light through beam twister 60 according to the present exemplary embodiment. FIG. 14 is a side view illustrating an optical path of laser light through beam twister 60 according to the present exemplary embodiment. FIG. 15 is a top view illustrating an optical path of laser light through beam twister 60 according to the present exemplary embodiment.

As illustrated in FIG. 9 to FIG. 11, beam twister 60 is an optic including cylinders 61, each of which has convex lenses on both sides, stacked at angle d62. In the present exemplary embodiment, angle d62 is 45 degrees, and thus, as illustrated in FIG. 10 and FIG. 11, laser light incident on the front surface is inclined at 90 degrees and emitted from the rear surface. In other words, the fast axis direction and the slow axis direction of the laser light can be interchanged. The arrows in FIG. 9 indicate the direction of travel of laser light. FIG. 10 is an illustration of beam twister 60 as seen from the left side in FIG. 9. FIG. 11 is an illustration of beam twister 60 as seen from the right side in FIG. 9. As illustrated in FIG. 12, in the present exemplary embodiment, cylinder 61 is 1.55 mm in thickness d64 in the direction perpendicular to the light emission surface of laser diode 10, and 0.2121 mm in height d63 of the side surface. In the present exemplary embodiment, the radius of curvature of a curved surface of cylinder 61 is 0.352 mm, and the index of refraction of cylinder 61 is 1.85280. Note that the side surface of cylinder 61 spans the height of the laser light entry surface and the laser light exit surface, and the height of the side surface is the length of cylinder 61 in the up-and-down direction on the sheet of FIG. 12. The curved surface of cylinder 61 is the laser light entry surface and the laser light exit surface.

As illustrated in FIG. 13 to FIG. 15, the laser light incident on the front surface (the surface facing the laser diode 10) of beam twister 60 including cylinders 61 arranged at 45 degrees is refracted by beam twister 60 so as to be turned while traveling through beam twister 60, and exits from the rear surface (the surface opposite the front surface) of beam twister 60 after being rotated 90 degrees. As a result, the fast axis and the slow axis of the laser light are interchanged in position. Note that the laser light is already collimated in the fast axis direction, but remains diverged in the slow axis direction.

4. Size of Each Unit of Laser Module 1

Figure 16:
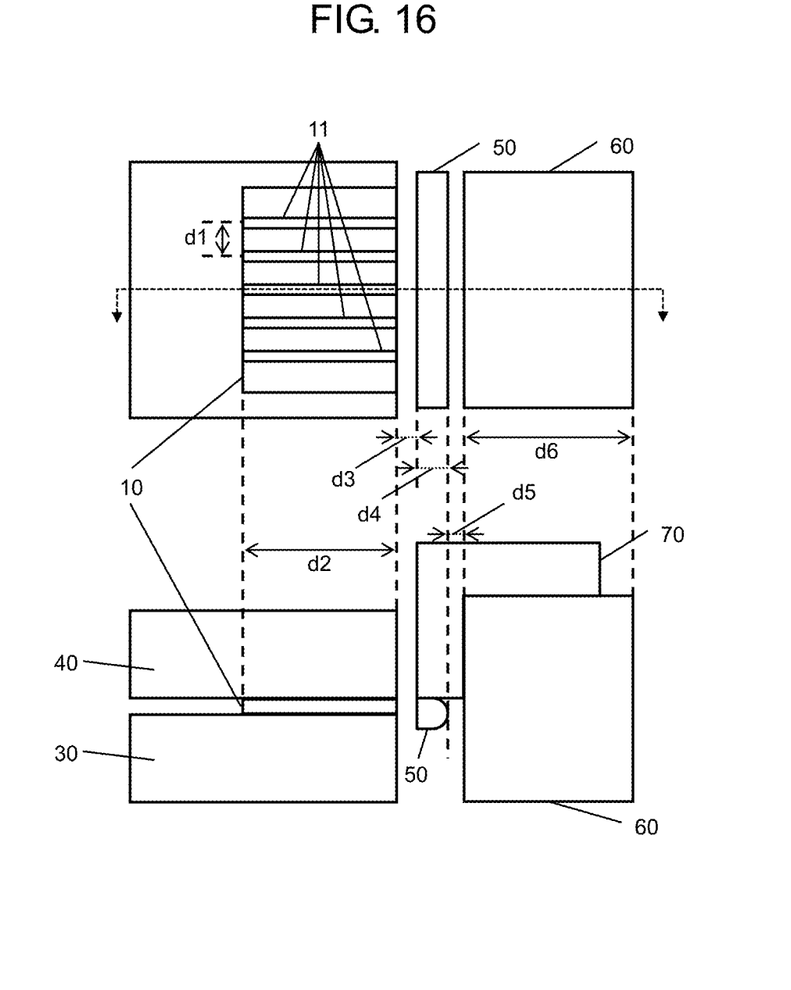
FIG. 16 is an illustration of top and side surfaces of laser module 1 according to an exemplary embodiment, for explaining the size relationship in laser module 1.

Next, the size, number, etc., of elements will be described with reference to FIG. 16. FIG. 16 is an illustration of top and side surfaces of laser module 1 according to the present exemplary embodiment, for explaining the size relationship in laser module 1.

As illustrated in FIG. 16, laser diode 10 including five emitters 11 is described in the present exemplary embodiment. First, the size of each unit of laser module 1 will be described. The pitch between emitters 11 is denoted by d1, which is set to 300 µm in the present exemplary embodiment. Note that the pitch between emitters 11 is a distance from the center of emitter 11 to the center of adjacent emitter 11. The pitch between emitters 11 is preferably from approximately 295 µm to approximately 305 µm, and more preferably from approximately 298 µm to approximately 302 µm.

Next, the length of emitter 11 (the length in the direction perpendicular to the light emission surface) is denoted by d2, which is set to 6 mm in the present exemplary embodiment. The length of emitter 11 is equal to the length of laser diode 10 in the direction in which emitter 11 extends. An end surface treatment is applied to the surface of laser diode 10 opposite the light emission surface so that the surface totally reflects the laser light. Note that the width of emitter 11 on the light emission surface (the length of emitter 11 in the direction in which emitters 11 are adjacent to each other) is 105 µm in the present exemplary embodiment. The length of emitter 11 is preferably from approximately 2 mm to approximately 8 mm, and more preferably from approximately 4 mm to approximately 7 mm.

Next, the distance between the light emission surface of laser diode 10 and fast collimating lens 50 is denoted by d3, which is set to 50 µm in the present exemplary embodiment. The distance between the light emission surface of laser diode 10 and fast collimating lens 50 is preferably from approximately 30 µm to approximately 70 µm, and more preferably from approximately 40 µm to approximately 60 µm. Note that the height of the side surface of fast collimating lens 50 is great enough for entry of all the laser light diverged in the fast axis direction. The length of the side surface of fast collimating lens 50 is great enough for entry of all the laser light from laser diode 10.

Next, the thickness of fast collimating lens 50 (the thickness in the direction perpendicular to the light emission surface) is denoted by d4, which is set to 170.0 µm in the present exemplary embodiment. The thickness of fast collimating lens 50 is preferably from approximately 100.0 µm to approximately 240.0 µm, and more preferably from approximately 120.0 µm to approximately 220.0 µm. Note that the position of fast collimating lens 50 is determined by the focal length of fast collimating lens 50 through the curved surface thereof and the divergence of the laser light in the fast axis direction. Therefore, in order to position fast collimating lens 50 as close to the light emission surface of laser diode 10 as possible, the flat surface of fast collimating lens 50 is preferably on the laser diode 10 side, as illustrated in FIG. 16.

Next, the distance between fast collimating lens 50 and beam twister 60 is denoted by d5, which is set to 20 µm in the present exemplary embodiment. The distance between fast collimating lens 50 and beam twister 60 is preferably from 0 µm to approximately 60 µm, and more preferably from 0 µm to approximately 40 µm. Note that since the divergence in the slow axis direction remains, it is better that the position of beam twister 60 be as close to fast collimating lens 50 as possible, and beam twister 60 may come into contact with fast collimating lens 50 (the distance may be 0

μm). However, considering the processing accuracy of cylinders 61 of beam twister 60, it is practical to place fast collimating lens 50 and beam twister 60 a short distance away from each other.

Next, the thickness of beam twister 60 (the thickness in the direction perpendicular to the light emission surface) is denoted by d6, which is set to 1.55 mm in the present exemplary embodiment. The thickness of beam twister 60 is preferably from approximately 1.53 mm to approximately 1.57 mm, and more preferably from approximately 1.54 mm to approximately 1.56 mm. This is a distance necessary for rotating laser light 90 degrees inside beam twister 60 and is defined by the curvatures of both end surfaces of beam twister 60.

The width of single emitter 11 (the length in the direction in which emitters 11 are adjacent to each other) is set to 100 μm in the present exemplary embodiment, preferably from approximately 5 μm to approximately 120 μm, and more preferably from approximately 70 μm to approximately 115 μm. The number of emitters 11 provided in single laser diode 10 is set to 20 in the present exemplary embodiment, preferably from 3 to 35, and more preferably from 3 to 20.

5. Relationship Between Width of Laser Diode 10 and Output of Laser Module 1

Figure 17:
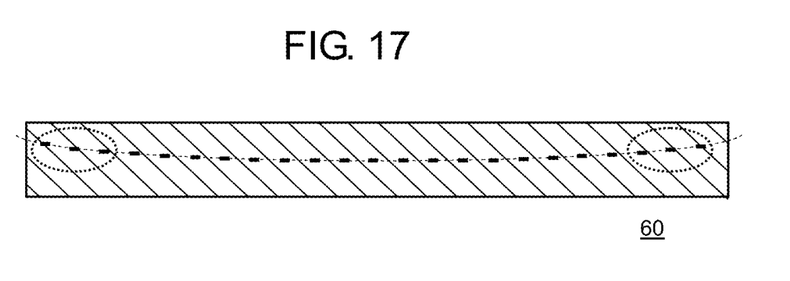
FIG. 17 is a front view of beam twister 60 with warped laser diode 10 according to an exemplary embodiment.
Figure 18:
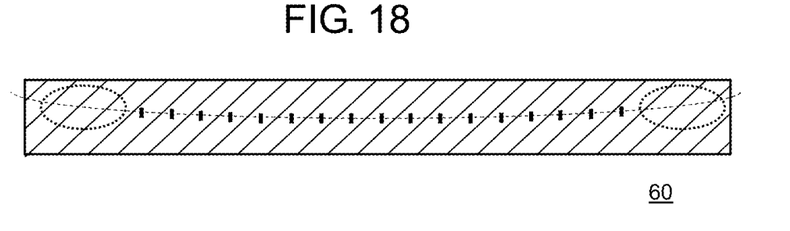
FIG. 18 is a rear view of beam twister 60 with warped laser diode 10 according to an exemplary embodiment.

Next, the width of laser diode 10 and the total output of laser light (the output of laser module 1) will be described with reference to FIG. 17 and FIG. 18. FIG. 17 is a front view of beam twister 60 with warped laser diode 10 according to the present exemplary embodiment. FIG. 18 is a rear view of beam twister 60 with warped laser diode 10 according to the present exemplary embodiment. Note that in FIG. 17 and FIG. 18, laser light shorter in the fast axis direction than in the slow axis direction is illustrated as an example, but this is not a limiting example, and in actuality, the laser light may be longer in the fast axis direction than in the slow axis direction.

Assuming that the pitch between emitters 11 is constant, an increase in the width of laser diode 10 allows for providing more emitters 11, leading to an increase in the total output of laser light. However, when laser diode 10, which is warped in the manufacturing process, is heated by a flowing electric current for outputting laser light, the warpage of laser diode 10 increases. An increase in this warpage of laser diode 10 will result in positional misalignment of laser light relative to the curved surface of each beam twister 60, as illustrated in FIG. 17 and FIG. 18. Consequently, some laser light is not within the curved surface of beam twister 60 such as the laser light in the regions enclosed by the dashed lines in FIG. 17 and FIG. 18. Such laser light is rejected on the entry surface of beam twister 60 and not output from laser module 1. The width of laser diode 10 needs to be 8 mm or less and preferably is 6 mm or less in consideration of loss of such laser light due to the warpage of laser diode 10.

6. Relationship Between Pitch Between Emitters 11 and Output of Laser Module 1

Figure 19:
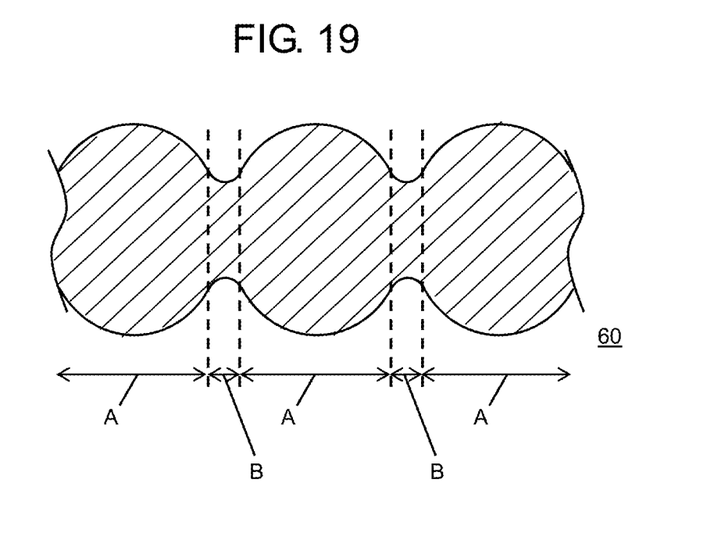
FIG. 19 is a cross-sectional view taken along line XIX-XIX in FIG. 10.

Next, the pitch between emitters 11 and the total output of laser light (the output of laser module 1) will be described with reference to FIG. 19. FIG. 19 is a cross-sectional view taken along line XIX-XIX in FIG. 10. Assuming that the width of laser diode 10 is 6 mm, the pitch between emitters 11 and the total output of laser light (the output of laser module 1) will be described. When the width of laser diode 10 is constant, the number of emitters 11 is determined in inverse proportion to the pitch between emitters 11. For example, when the pitch between emitters 11 is 200 μm, the number of emitters 11 is 30 (6 mm±200 μm). When the pitch between emitters 11 is 300 μm, the number of emitters 11 is 20 (6 mm±300 μm). When the pitch between emitters 11 is 500 μm, the number of emitters 11 is 12 (6 mm 500 μm). Assuming that the widths of emitters 11 are equal, the total output of laser light increases as the number of emitters 11 increases. However, when the pitch between emitters 11 is too small, laser light is rejected on the entry surface of beam twister 60 and not output from laser module 1 due to the limit of processing accuracy of the curved surface of beam twister 60. As illustrated in FIG. 19, effective region A having a lens function at the center of cylinder 61 and non-effective region B having no lens function are present on the entry surface and the reflective surface of beam twister 60. Laser light incident on the entry surface of beam twister 60 that is in non-effective region B is rejected on the entry surface. The pitch between emitters 11 needs to be 250 μm or more and preferably is 300 μm or more in consideration of loss of such laser light due to the processing accuracy of beam twister 60.

7. Relationship between Width of Emitter 11 and Output of Laser Light

Next, assuming that the width of laser diode 10 is 6 mm, the pitch between emitters 11 is 300 μm, and the number of emitters 11 is 20, the width of emitter 11 and the total output of laser light (the output of the laser module 1) will be described. When the pitch between emitters 11 and the number of emitters 11 are constant, the output of emitters 11 is determined according to the width of emitter 11, and thus, the output of laser light from laser module 1 is determined. However, when the width of emitter 11 increases, the distance from adjacent emitter 11 is reduced, making it easy for the laser light from emitter 11 and the laser light from adjacent emitter 11 to overlap each other in the slow axis direction, and laser light is incident on cylinder 61 of beam twister 60, even at the end. However, when the width of emitter 11 is too large, laser light is rejected on the entry surface of beam twister 60 and not output from laser module 1 due to the limit of processing accuracy of the curved surface of beam twister 60. The reason for this is the same or similar to the above reason described with reference to FIG. 19. The width of emitter 11 needs to be 120 μm or less and preferably is 105 μm or less in consideration of loss of laser light due to the processing accuracy of beam twister 60.

8. Result Verification

Figure 20:
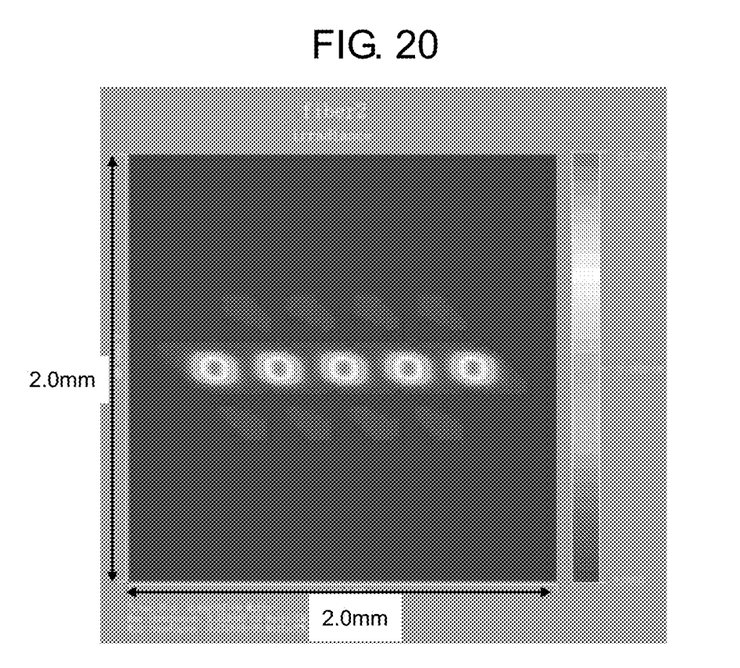
FIG. 20 is an illustration representing intensity of laser light emitted from laser module 1 according to an exemplary embodiment, measured on an exit surface of beam twister 60.
Figure 21:
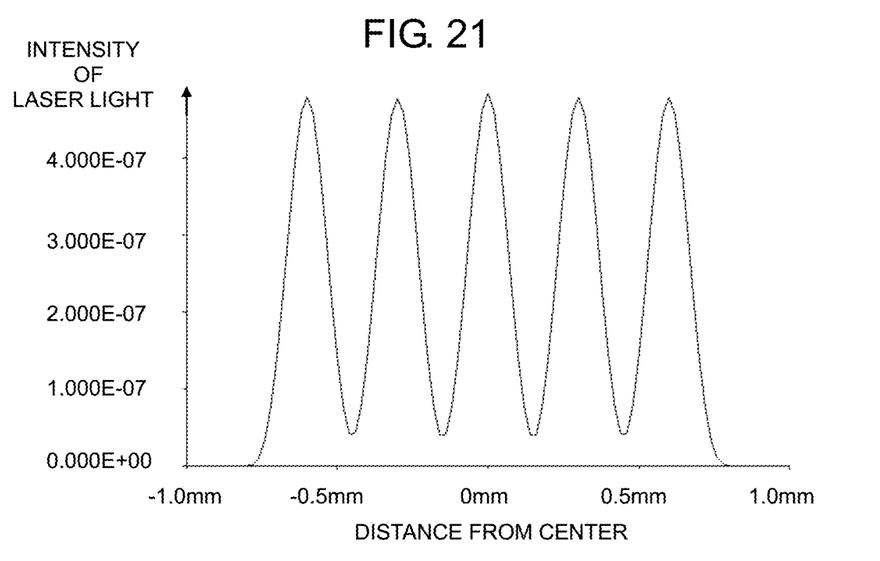
FIG. 21 is a graph illustrating intensity of laser light emitted from laser module 1 according to an exemplary embodiment, measured on an exit surface of beam twister 60.
Figure 22:
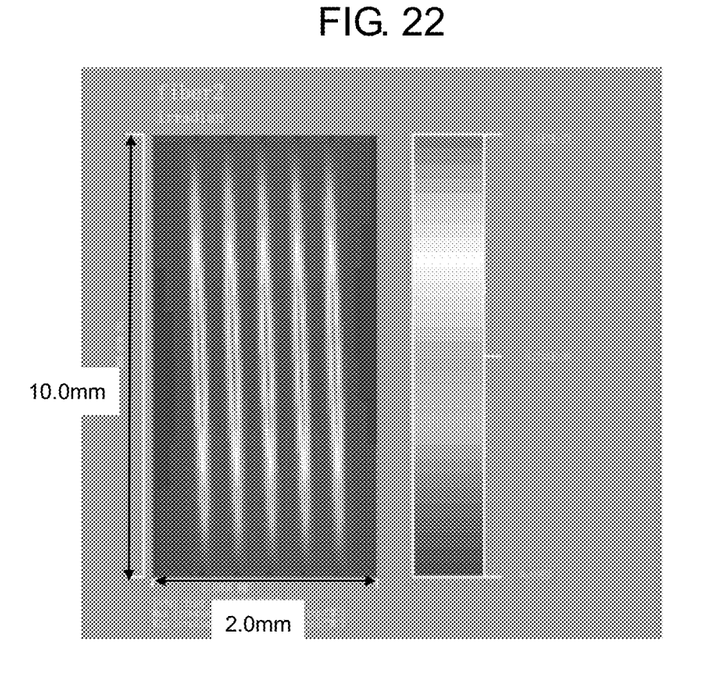
FIG. 22 is an illustration representing intensity of laser light emitted from laser module 1 according to an exemplary embodiment, measured at a distance of 50 mm away from beam twister 60.
Figure 23:
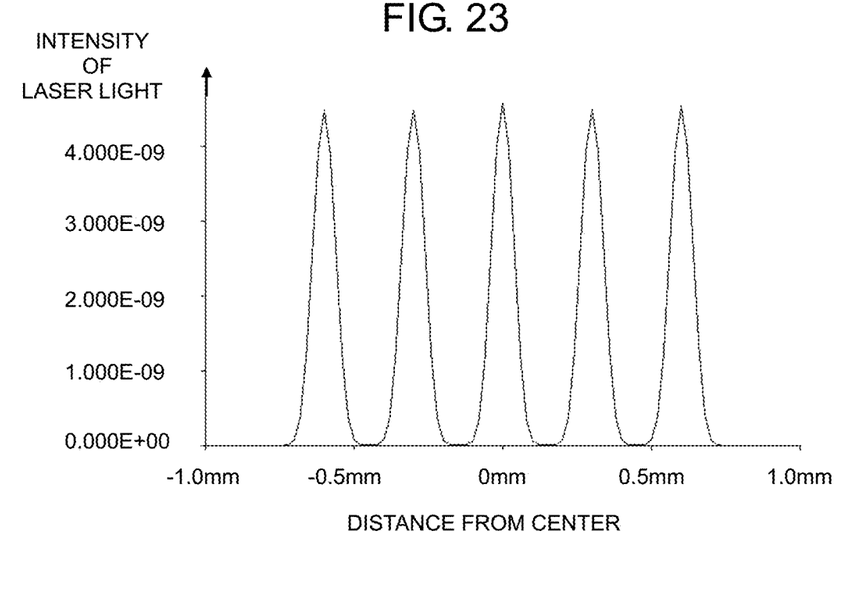
FIG. 23 is a graph illustrating intensity of laser light emitted from laser module 1 according to an exemplary embodiment, measured at a distance of 50 mm away from beam twister 60.
Figure 24:
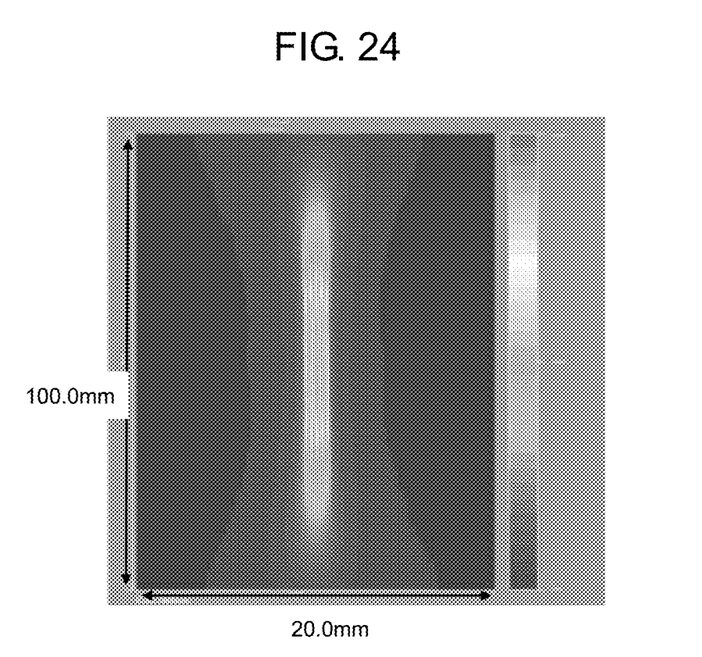
FIG. 24 is an illustration representing intensity of laser light emitted from laser module 1 according to an exemplary embodiment, measured at a distance of 600 mm away from beam twister 60.
Figure 25:
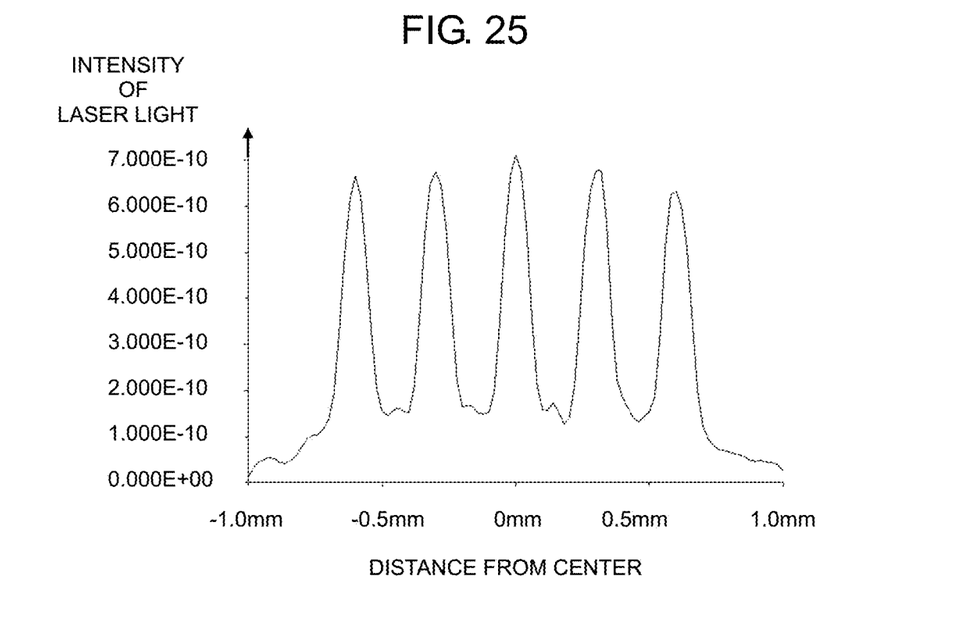
FIG. 25 is a graph illustrating intensity of laser light emitted from laser module 1 according to an exemplary embodiment, measured at a distance of 600 mm away from beam twister 60.

The laser light from laser module 1 according to the present exemplary embodiment will be described with reference to FIG. 20 to FIG. 25. FIG. 20 is an illustration representing intensity of laser light emitted from laser module 1 according to the present exemplary embodiment, measured on the exit surface of beam twister 60. FIG. 21 is a graph illustrating intensity of laser light emitted from laser module 1 according to the present exemplary embodiment, measured on the exit surface of beam twister 60. FIG. 22 is an illustration representing intensity of laser light emitted from laser module 1 according to the present exemplary embodiment, measured at a distance of 50 mm away from beam twister 60. FIG. 23 is a graph illustrating intensity of laser light emitted from laser module 1 according to the present exemplary embodiment, measured at a distance of 50 mm away from beam twister 60. FIG. 24 is an illustration representing intensity of laser light emitted from laser module 1 according to the present exemplary embodiment, measured at a distance of 600 mm away from beam twister 60. FIG. 25 is a graph illustrating intensity of laser light emitted from laser module 1 according to the present exemplary embodiment, measured at a distance of 600 mm away from beam twister 60.

FIG. 20 to FIG. 25 are results of confirming laser light isolation in the fast axis direction by using five beams of laser light from five emitters 11. It was confirmed that as illustrated in FIG. 20 to FIG. 25, the laser light was isolated in the fast axis direction, even at a distance of 600 mm away from beam twister 60, in the present exemplary embodiment. With this, it was also confirmed that the laser light had high beam quality.

INDUSTRIAL APPLICABILITY

With a laser module in the present disclosure, due to the width of the emitter and the pitch between the emitters being more specifically defined, it is possible to obtain high output laser light of high beam quality in the laser processing such as laser cutting and laser welding, which is industrially useful.

The invention claimed is:

1. A laser module, comprising:
a laser diode that includes a plurality of emitters and emits laser light from each of the plurality of emitters through a light emission surface;
a first collimating lens that is provided at a first distance away from the light emission surface of the laser diode and parallelizes a fast-axis-wise divergence of the laser light;
a beam twister that is provided at a second distance away from the first collimating lens and turns the laser light approximately 90 degrees; and
an L-shaped pedestal that (i) rigidly fixes the first collimating lens on an outside side-surface of the L-shaped pedestal and (ii) rigidly fixes the beam twister on an inside side-surface of the L-shaped pedestal and an inside bottom-surface of the L-shaped pedestal, wherein
each of the plurality of emitters has a width of 5 μm to 120 μm on the light emission surface,
the plurality of emitters have a pitch of 295 μm to 305 μm on the light emission surface, and
a top surface of the beam twister is rigidly fixed to the inside bottom-surface of the L-shaped pedestal and a side surface of the beam twister is rigidly fixed to the inside side-surface of the L-shaped pedestal.

2. The laser module according to claim 1, wherein the first distance is 30 μm to 70 μm.

3. The laser module according to claim 2, wherein the first distance is 40 μm to 60 μm.

4. The laser module according to claim 1, wherein the second distance is 0 μm to 60 μm.

5. The laser module according to claim 4, wherein the second distance is 0 μm to 40 μm.

6. The laser module according to claim 1, wherein each of the plurality of emitters has a length of 2 mm to 8 mm in a direction perpendicular to the light emission surface.

7. The laser module according to claim 6, wherein each of the plurality of emitters has a length of 4 mm to 7 mm in the direction perpendicular to the light emission surface.

8. The laser module according to claim 1, wherein each of the plurality of emitters has a width of 70 μm to 115 μm on the light emission surface.

9. The laser module according to claim 1, wherein the plurality of emitters have a pitch of 298 μm to 302 μm on the light emission surface.

10. The laser module according to claim 1, wherein a side surface of the first collimating lens is flush with the outside side-surface of the L-shaped pedestal.

* * * * *